United States Patent [19]

Mellen, Sr.

[11] 4,086,424
[45] Apr. 25, 1978

[54] DYNAMIC GRADIENT FURNACE AND METHOD

[76] Inventor: Robert H. Mellen, Sr., P.O. Box 535, New London, N.H. 03257

[21] Appl. No.: 783,269

[22] Filed: Mar. 31, 1977

[51] Int. Cl.² ............................................. B01J 17/08
[52] U.S. Cl. ................................... 13/24; 13/DIG. 1; 156/617 V
[58] Field of Search .................. 13/24, DIG. 1, 25; 219/483; 23/273 Z, 273 SP, 301 SP; 156/616 R, 617 H, 617 V

[56] References Cited

U.S. PATENT DOCUMENTS

| 2,516,570 | 7/1950 | Hartwig et al. | 13/24 X |
| 2,719,799 | 10/1955 | Christian | 13/24 X |
| 2,773,923 | 12/1956 | Smith | 156/617 H UX |
| 3,984,280 | 10/1976 | Besselere et al. | 156/617 H X |

Primary Examiner—R. N. Envall, Jr.
Attorney, Agent, or Firm—Thomas N. Tarrant

[57] ABSTRACT

A dynamic gradient furnace in which a plurality of heating zones along an axis of the furnace are controlled sequentially to provide a moving temperature gradient profile through the heating chamber of the furnace.

10 Claims, 3 Drawing Figures

DYNAMIC GRADIENT FURNACE AND METHOD

BACKGROUND OF THE INVENTION

1. Field of the Invention

The present invention relates to furnaces used generally for some form of chemical processing and particularly to such furnaces that provide a controlled variation in temperature over the processing time.

2. Description of the Prior Art

A particular application of the present type of furnace is in the growing of single crystals from a "melt". One common way to grow single crystals from a melt is to place the crystalline material in a shaped refractory container and then heat it in a furnace until it is molten. The molten material is then cooled slowly at one end until crystallization sets in starting from a single nucleation. Provided the cooling to crystallization temperature is done slowly and progressively along the length of the material, the crystal lattice can form entirely on the single nucleation so as to produce a single crystal. The usual optimum conditions for single crystal growth call for a rather steep temperature gradient that moves relative to the material. The two most common ways of moving the temperature gradient relative to the material are: (a) to physically move the material inside the furnace and (b) to hold the material stationary while moving the furnace. In the above two systems, the temperature zones inside the furnace are maintained constant.

A third way is to move the isotherm inside the furnace by means of temperature controls. This third way has not been popular since the approaches used have not provided a sufficiently precise moving gradient. The first two ways require the complication of physical transport with attendant heat loss and physical size problems.

SUMMARY OF THE INVENTION

Now in accordance with the present invention, a dynamic gradient furnace is provided giving a precisely defined temperature gradient moving within the furnace. The furnace utilizes a number of heating zones and a relatively lesser number of temperature controllers. The temperature controllers define the temperature gradient and are shifted sequentially as a group along the heating zones controlling successive zones to produce movement of the gradient. Temperature sensors are either shifted from zone to zone with respective controllers or the controllers are switched from sensor-to-sensor along with shifting zones. For highest precision with a limited number of zones, a ramp generator adds a false signal to the sensors to slow down the rate of temperature adjustment to that set by each successive controller. Complete movement of the gradient is then signalled by the end of the ramp to establish the time for each shift. Either manual or automatic shifting and/or switching can be provided depending on the amount of automation desired.

Thus it is an object of the invention to provide a dynamic gradient furnace with precise control of a temperature gradient within the furnace and movement of the gradient within the furnace.

It is a further object of the invention to provide a method of dynamic moving gradient temperature control.

Further objects and features of the invention will become apparent upon reading the following description together with the Drawing.

DESCRIPTION OF THE PREFERRED EMBODIMENT

The following description is particularly directed to an embodiment of the invention for crystal growing but other uses are contemplated and such specifics are not to be construed as limiting.

The phrase "dynamic gradient furnace" as used herein is defined as a furnace in which the temperature within a portion of the furnace varies along an axis of the furnace with a precise gradient, said gradient being movable from said portion along the axial length of the furnace. The described furnace uses a plurality of heating zones 1 to 21 each energized by separate heating coils. Other numbers of zones can be used.

Figure 1:
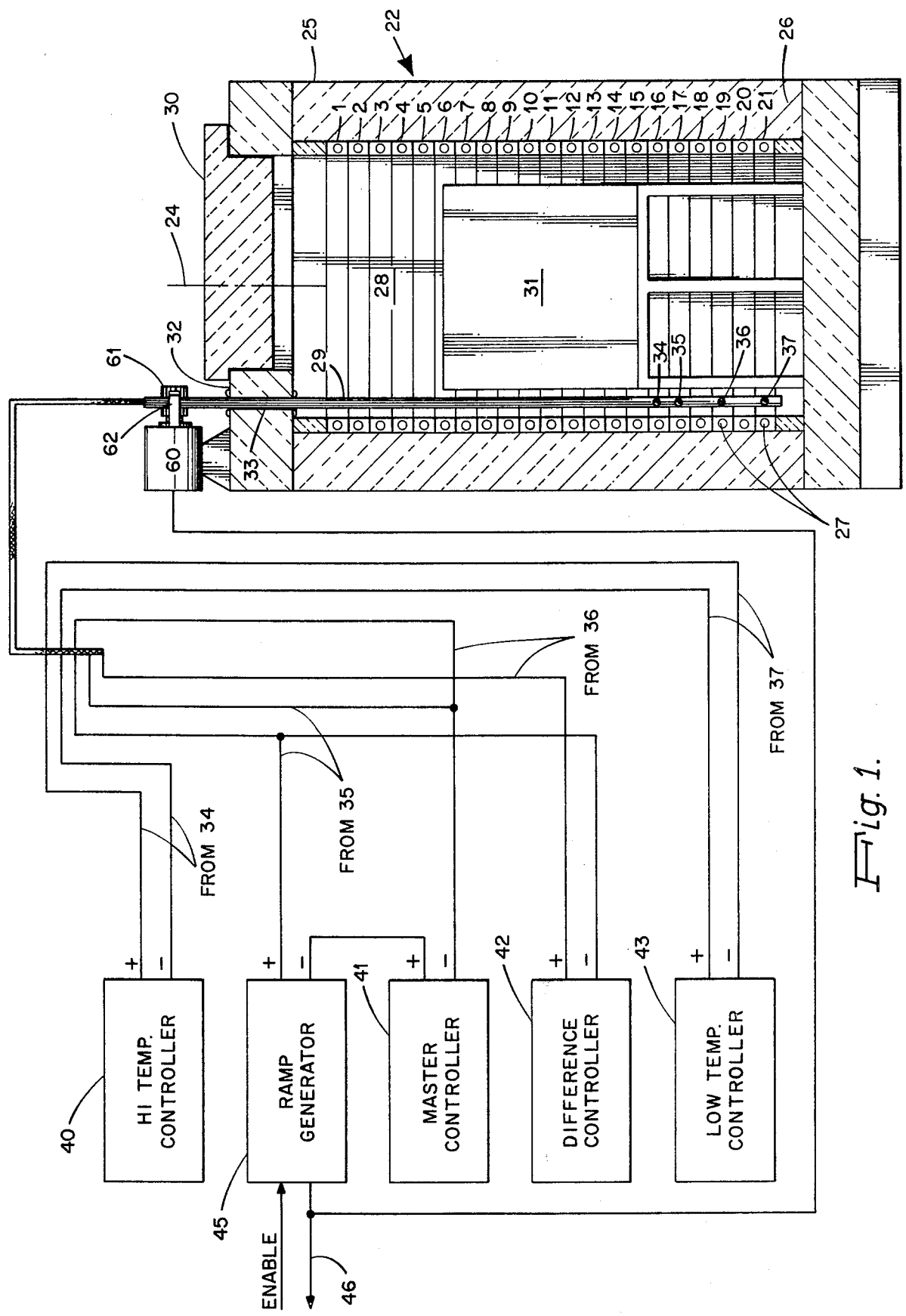
FIG. 1 is a diagrammatic view of a furnace according to the invention showing controllers in block form.

A preferred furnace 22 according to the invention is depicted diagrammatically in FIG. 1 as being generally cylindrical and having vertical axis 24. The depicted furnace is made with steel housing 25, insulated wall 26, heaters 27, cylindrical interior cavity 28 and cover 30. Material to be heated is depicted in cavity 28 as work charge 31. Heaters 27 are suitably twenty-one electrical heating elements each encircling cavity 28 in a horizontal plane so as to provide heating zones 1 to 21 stacked vertically.

While the furnace described is arranged vertically and the elements are electrical, neither the nature of the heating elements nor the attitude of the furnace are critical.

Portion 32 of wall 26 extends partially over the top of cavity 28 and has aperture 33 for passage of tube 29. Tube 29 carries thermocouple temperature sensors 34 to 37. Sensors 34 to 37 extend through apertures 38 in tube 29 so that the thermocouple junctions extend ½ inch to 1 inch into cavity 28.

Each of sensors 34 through 37 is connected by wires extending through tube 29 to temperature controllers 40 through 43. High temperature controller 40 is connected to sensor 34. It sets the high temperature of the gradient and applies sufficient energy to the heaters to which it is connected to reach and maintain that temperature. Low temperature controller 43 is connected to sensor 37. It sets the low temperature of the gradient and applies sufficient energy to the heaters to which it is connected to reach and maintain the low temperature.

While many types of temperature controllers use thermistors or the like for temperature sensing, the high temperatures contemplated in the present system are more suitably handled by high temperature thermocouples. With thermocouples, controllers 40 through 43 use voltage comparators and operate to balance a fixed reference voltage with the thermocouple voltage. As the thermocouple voltage approaches the reference voltage due to increasing temperature, the controller reduces the energy to the controlled heaters.

Temperature controller 41 is connected with its sensor inputs in series with the ramp outputs of ramp generator 45 and sensor 35. The connections are made so that the ramp voltage is subtracted from the thermocouple voltage. The set control temperature is considered as the temperature at which controller 41 will control with no ramp voltage present. In the example described the set control temperature for controller 41 is midway between the high and low temperatures. The ramp generator is adjusted so that, with no ramp being generated, it puts out the correct voltage bucking sensor 35 so that controller 41 actually controls at the high temperature. On starting the ramp function, the output from generator 45 ramps down to zero at the rate desired for the moving temperature gradient. When the ramp reaches zero, controller 41 controls at the median temperature. Instead of bucking the ramp voltage can add to the sensor voltage depending on the particular parameters of the system.

Temperature controller 41 is designated as a master since controller 42 is connected to stay at a fixed difference from 41. This is accomplished in the depicted embodiment by connecting the two leads of one polarity from sensors 35 and 36 together and connecting the two leads of the opposite polarity, one to each sensor input terminal of controller 42. In this way controller 42 sees the difference temperature of the two sensors and it is set to keep that difference at a constant magnitude.

In the embodiment described, the difference temperature controlled by controller 42 is most commonly established at half the temperature difference between high and low temperatures. Thus when controller 41 is controlling at the high temperature, controller 42 controls at the median temperature. As controller 41 is ramped down to the median temperature, controller 42 ramps down to the low temperature.

It is to be recognized that controllers 40 to 43 are identical controllers of a conventional type and only differ in the adjustment of the reference voltage to their voltage comparators and their external connections. Ramp function generator 45 can be a purchased function generator with a ramp function variable in slope and amplitude to meet the requirements of the specific sensors and time cycles.

Figure 2:
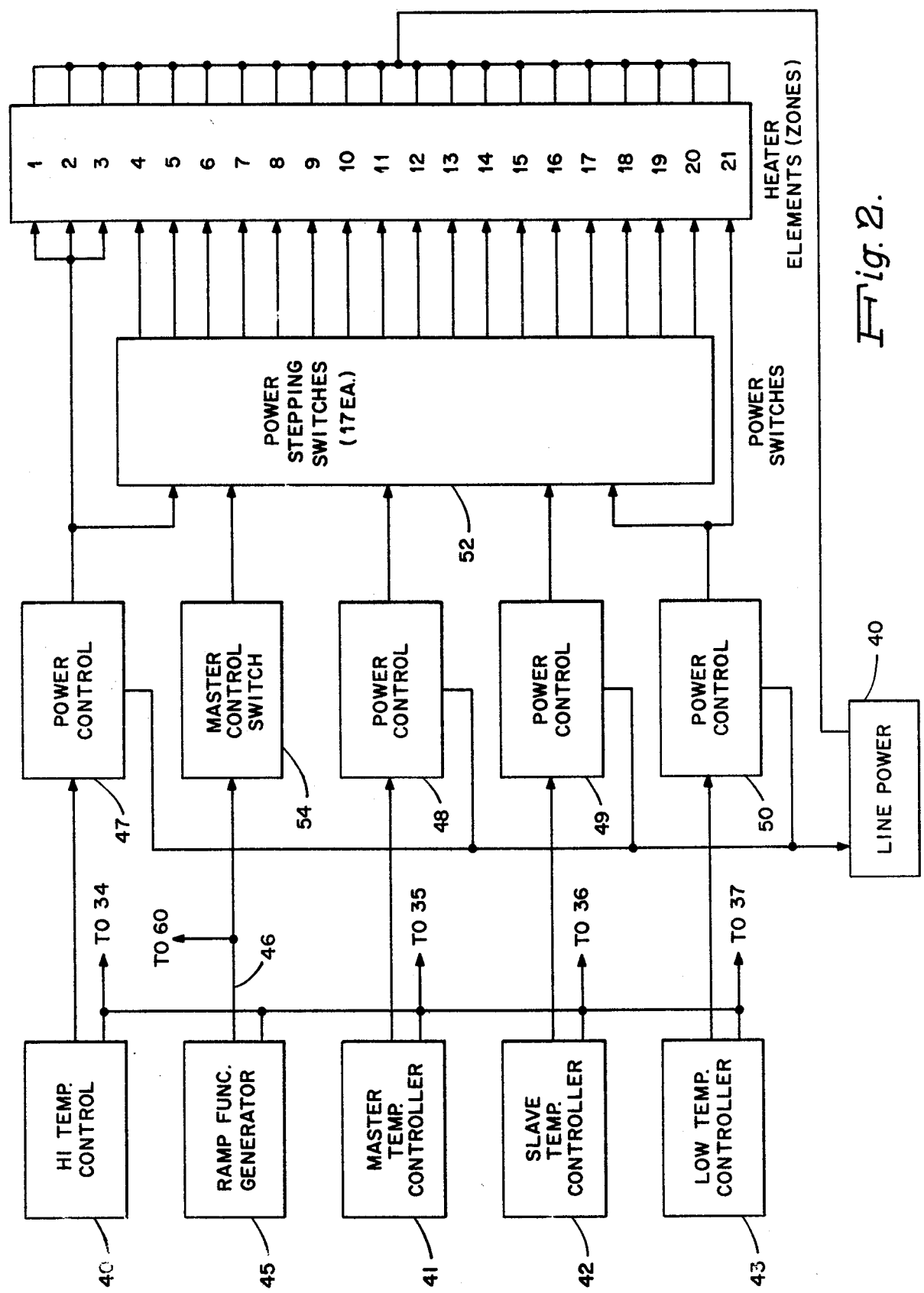
FIG. 2 is a block diagram of the control system of the furnace of FIG. 1.

A power control diagram for an electric furnace according to the invention is shown in FIG. 2. Control outputs of controllers 40 to 43 are connected to power controls 47 to 50 respectively. Power controls 47 to 50 are suitably solid state phase controllers each connected to electric line power 40. Power controls 47 to 50 act to provide variable power under control of respective temperature controllers 40 to 43. The output of each power control 47 to 50 is connected to a plurality of power stepping switches 52. Each of power stepping switches 52 is additionally connected to the heater for a single zone.

In the particular embodiment depicted twenty-one zones are used and stepping switches 52 are only connected to seventeen there thus being seventeen stepping switches. Zones 1, 2 and 3 are connected by fixed wiring to control 47 and zone 21 is connected by fixed wiring to control 50.

Figure 3:
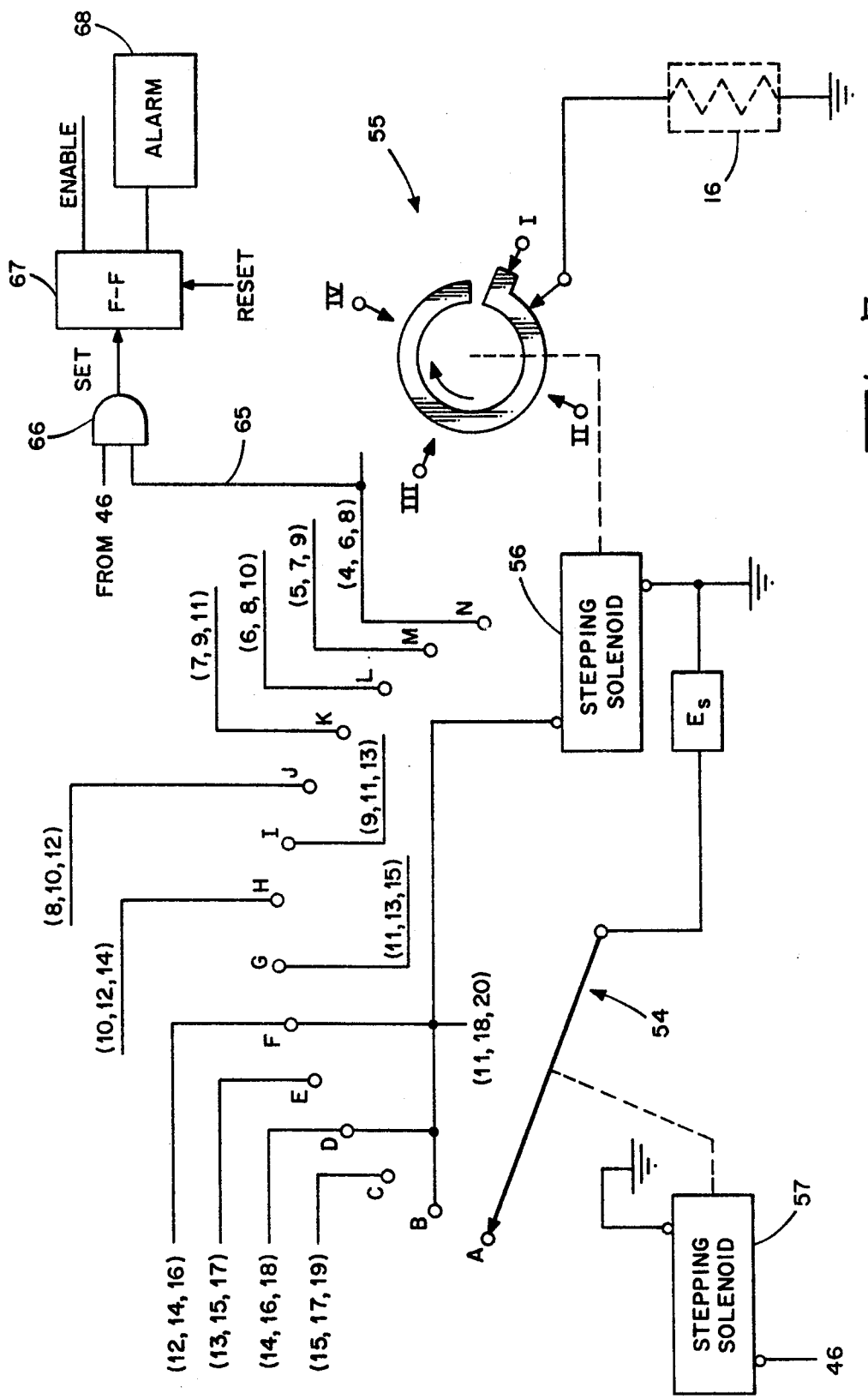
FIG. 3 is a partial schematic of switches as used in the control system of FIG. 2.

End of ramp output 46 from generator 45 is connected to master control switch 54. Schematic details of master control switch 54 and power stepping switch 55 are shown in FIG. 3. Stepping switch 55 is one of switches 52 used as exemplary. Switch 55 is depicted as the thirteenth of the seventeen switches and is connected to zone 16. Switch 55 is a single pole, four position switch rotatable one position at a time by stepping solenoid 56. Position I connects to power control 47, position II connects to power control 48, position III connects to power control 49 and position IV connects to power control 50. The following table gives the position connection for all the power stepping switches by zone giving the operative controller rather than the respective power control switch.

TABLE I

| Stepping Switches for Zones | Controller for Stepping Switch Position | | | |
|---|---|---|---|---|
| | I | II | III | IV |
| 4,5 | HI | MAST. | — | — |
| 6,7 | HI | MAST. | DIFF. | — |
| 8,16 | HI | MAST. | DIFF. | LOW |
| 17,18 | MAST. | DIFF. | LOW | — |
| 19,20 | DIFF. | LOW | — | — |

The other side of each electrical heater is connected to the common side of line power 40.

Master Control Switch 54 is depicted as a fourteen position rotary switch operated by stepping solenoid 57. Solenoid 57 is driven by end-of-ramp output from ramp generator 45. The fourteen switch positions have been designated by letters A through N. Table II gives the positions of master stepping switch 54 in relation to controllers 40, 41, 42 and 43 and the heater zones, 1–21, each controller controls. The bottom section of Table II gives the zone position of sensors 34 to 37 for each position of switch 54.

TABLE II

| POSITION | A | B | C | D | E | F | G | H | I | J | K | L | M | N |
|---|---|---|---|---|---|---|---|---|---|---|---|---|---|---|
| HI TEMP. | | | | | | | | | | | | | | |
| Controller 40 | 1–16 | 1–15 | 1–14 | 1–13 | 1–12 | 1–11 | 1–10 | 1–9 | 1–8 | 1–7 | 1–6 | 1–5 | 1–4 | 1–3 |
| MASTER Controller 41 | 17 | 16 | 15 | 14 | 13 | 12 | 11 | 10 | 9 | 8 | 7 | 6 | ;11 5 | 4 |
| DIFFERENCE Controller 42 | 18 | 17 | 16 | 15 | 14 | 13 | 12 | 11 | 10 | 9 | 8 | 7 | 6 | 5 |
| | 19 | 18 | 17 | 16 | 15 | 14 | 13 | 12 | 11 | 10 | 9 | 8 | 7 | 6 |
| | 20 | 19 | 18 | 17 | 16 | 15 | 14 | 13 | 12 | 11 | 10 | 9 | 8 | 7 |
| LOW TEMP. Controller 43 | 21 | 20 | 19 | 18 | 17 | 16 | 15 | 14 | 13 | 12 | 11 | 10 | 9 | 8 |
| | | 21 | 21 | 21 | 21 | 21 | 21 | 21 | 21 | 21 | 21 | 21 | 21 | 21 |
| SENSOR 34 | 16 | 15 | 14 | 13 | 12 | 11 | 10 | 9 | 8 | 7 | 6 | 5 | 4 | 3 |
| SENSOR 35 | 17 | 16 | 15 | 14 | 13 | 12 | 11 | 10 | 9 | 8 | 7 | 6 | 5 | 4 |
| SENSOR 36 | 19 | 18 | 17 | 16 | 15 | 14 | 13 | 12 | 11 | 10 | 9 | 8 | 7 | 6 |
| SENSOR 37 | 21 | 20 | 19 | 18 | 17 | 16 | 15 | 14 | 13 | 12 | 11 | 10 | 9 | 8 |

End-of-ramp output 46 from generator 45 steps both switch 54 and stepping motor 60. Stepping motor 60 is mounted on portion 32 of furnace wall 26. Motor 60 drives pinion gear 61. Tube 29 carries a gear rack (back of tube 29 not shown), which meshes with gear 61. Mounted from motor 60 in opposition to gear 61 is guide bar 62. Tube 29 rides between gear 61 and bar 62, being held against gear 61 by bar 62. The lands and grooves of the gear rack (not shown) in tube 29 are formed so that the land areas are continuous with the surface circumference of the tube. This permits the use of a gas sealing collar around tube 29 in aperture 33. The gas seal is desirable when inert gases are used in the furnace for prevention of oxidation or combustion.

Stepping motor 60 is designed along with the rack-and-pinion gear ratio to move tube 29 vertically one zone displacement for each end of ramp pulse.

For operation of the above described embodiment, an exemplary temperature range is 900° C for the high temperature and 700° C for the low temperature. The furnace is first raised essentially to the high temperature and the moving gradient lowers the temperature. The set control temperature for controller 40 is 900°, the set control temperature for controller 41 is 800°, the set control temperature for controller 42 is 100° difference between sensors 35 and 36 and the set control temperature for controller 43 is 700°. Ramp function generator 45 puts out a high voltage at the ramp output to controller 41 in the absence of ramp generation. With switch 54 in position A and connections as indicated in Table II, line power is applied. Furnace 22 stabilizes with zones 1 to 18 at 900°, zones 19 and 20 at 800° and zone 21 at 700°. Controller 41 is controlling at 100° above its set control temperature due to the high ramp bucking voltage from generator 45.

Having stabilized the high temperature condition, the moving gradient is commenced by starting generator 45 which ramps down to zero at a rate that is set for the speed required of the gradient movement. When the ramp output reaches zero, controller 41 will be controlling at 800° and controller 42 will be controlling at 700°. The end-of-ramp output 46 then steps switch 54 to position B. Output 46 also steps stepmotor 60 moving sensors 34 to 37 to the new zones indicated in Table II.

Controller 41, starting with a new ramp from generator 45, now brings zones 16 and 17 slowly down to 800° at the ramp rate. Simultaneously controller 42 brings zones 18 and 19 down to 700° at the same rate. This process continues as indicated in Table II until, at position N of master switch 54, zones 1–3 remain at 900°, zones 4 and 5 are ramped down to 800°, zones 6 and 7 are ramped down to 700° and zones 8 to 21 remain at 700°.

At this point the situation remains static until all the switches are reset. End of cycle signal 65 is conveniently connected from terminal N of switch 54 to logic gate 66. Logic gate 66, in the end of ramp path, is provided to set flip-flop 67 after position N is reached. The output of flip-flop 67 provides an enable voltage to generator 45 which is interrupted when flip-flop 67 is set. Alarm signal 68, connected to the complementary output of flip-flop 67, provides an end of cycle alarm visually, sonically or both. Further stepping of switch 54 and motor 60 is prevented by micro switches (not shown) activated by the final position of each.

While the invention has been described with relation to a specific embodiment, it is subject to many variations generally in accordance with the following more generalized description.

The Dynamic Gradient Furnace is set up to have a sufficient number of zones, approximately 1 to 2 inches wide each, to enable the required gradient length to be formed at the start of the cycle either below or above or left or right of the work charge depending on whether furnace is horizontal or vertical.

Either the high or low temperature may be moved over the work charge first. In crystal growth it would be more normal to move the higher temperature over the work first. The temperature gradient is then used to freeze the molton mass producing the desired single crystal growth. The lower temperature is then held on the frozen crystal until the entire work charge has crystallized.

A sufficient number of gradient temperature controllers are set up and utilized to maintain the desired uniformity between the high and low temperature points of the gradient. The length or steepness of the desired gradient is then set up based on the capabilities of the furnace and the desired time cycle. The number of gradient temperature controllers required is based on the furnace capabilities and the desired uniformity. FIG. 2 shows a block diagram of a typical control system. The gradient controllers are narrow band type to ensure accuracy of gradient temperature control and the high and low temperature controllers are high stability types to ensure long term repeatable results.

Low and high temperature controllers control the lower and upper temperature ends of the gradient. They are completely independent from the gradient controllers and the ramp function generator.

In the example described a master and a single difference controller control the gradient. One master is required. The number of difference controllers required for a particular operation is based on the length, the uniformity and the design characteristics of the furnace. In the case shwon in FIG. 1 the master is set at the middle temperature required and the slave is set at a difference equal to half the temperature range. With more than one slave, the differences used are smaller.

After the furnace and work charge are stabilized at temperature with the desired start of cycle gradient, the temperature control sensors are all physically moved up one position in the furnace, see FIG. 1.

While sensors 34 to 37 are shown as carried in reciprocable tube 29, they have also been utilized by supporting in rods positionable in wells through wall 26 of furnace 22. When positioned in wells, they have been moved manually by withdrawing and shifting as required. Still another arrangement provides fixed sensors for each position with the sensors electrically switched at the controller inputs in the proper sequence.

The ramp function generator, through the addition or subtraction of its millivolt signal to the master temperature controller programs the temperatures at the desired rate (either up or down). At the end of the ramp the gradient has now moved up one position or one zone in the furnace. This movement of the sensors, ramping down of the programmer, etc., is repeated until the entire work charge has been traversed by the gradient.

In unison with switching the temperature control sensors, the movement of the gradient is further accomplished by energizing the master stepping switch. The master stepping switch rotation is initiated by a signal from the ramp function generator. The master stepping switch causes the heating elements (zones) to be controlled by the proper temperature controllers.

The gradient which has previously been established at the desired rate is then introduced again in the ramp function generator which in effect is fooling the controllers by introducing a signal into the temperature controllers sensor.

Establishing the rate of movement of the master stepping switch in time segments relative to the normal rate of inches/hour formerly used is a simple mathematical calculation. The ramp function generator is set up in time segments required to traverse its full scale and thus combining this time function with the desired gradient in degrees per inch of furnace will result in practically any type of program desired.

What temperature controller controls which zone is entirely dependent on the position of individual power stepping switches. The power output stepping switch relative position is changed by the master stepping switch to produce the desired combinations.

Thus it is intended to cover the invention as set forth more particularly in the following claims.

I claim:

1. A dynamic gradient furnace in which the isotherm is movable under control comprising:
    (a) A furnace enclosing a heating chamber;
    (b) a plurality of individually controllable heating zones encircling said chamber in stacked sequence;
    (c) a plurality of temperature control means each connected to control at least one of said zones;
    (d) transfer means for transferring said control means between zones; and
    (e) ramp function means for effecting a change in temperature control of at least one of said temperature control means at a predetermined rate after transfer of said control means between zones.

2. A dynamic gradient furnace according to claim 1 wherein said plurality of temperature control means comprises a first temperature controller set at the high temperature for the furnace, a second temperature controller set at the low temperature for the furnace and a third temperature controller that varies its control over at least a portion of the range between one of said first and said second temperature controllers and the other in response to a voltage ramp from said ramp function means.

3. A dynamic gradient furnace according to claim 2 wherein said temperature control means further comprises a fourth temperature controller set to maintain a fixed difference temperature from the zones controlled by said third temperature controller.

4. A dynamic gradient furnace according to claim 1 wherein each of said temperature control means includes a connected temperature sensor located to sense the temperature in said heating chamber relative to a given heating zone controlled by said control means, said temperature sensor being moved to other zones when said transfer means transfers said control means between zones.

5. A dynamic gradient furnace according to claim 4 wherein said ramp function means is a cyclical ramp generator and said transfer means is actuated by each cycle of said ramp to transfer at least one of said control means sequentially from zone to zone.

6. A method of generating and moving a temperature gradient within a furnace having a plurality of circumferential heating elements in stacked sequence comprising:
    (a) Controlling the temperature at a first end of said furnace with a first temperature controller set to control at a high temperature;
    (b) controlling the temperature at a second end of said furnace with a second temperature controller set to control at a low temperature;
    (c) establishing a temperature gradient by controlling at least one heating element at a temperature between said high and said low temperature;
    (d) moving said gradient by transferring said control of at least one heating element sequentially from element to element while simultaneously extending and contracting the number of heating elements controlled by said first and said second temperature controller so that all heating elements are controlled.

7. A method according to claim 6 wherein said controlling at least one heating element comprises connecting a third temperature controller to at least one heating element and said moving said gradient further comprises applying a control ramp to said third controller to vary its effective control temperature over the time interval during which the gradient is to move for each transfer of said control.

8. A method according to claim 7 wherein said transferring of said control comprises transferring a temperature sensor in said furnace, and said control ramp is applied as a signal algebraically added to the signal of said sensor.

9. A method according to claim 7 further comprising connecting a fourth controller to at least one heating element and setting said fourth controller to maintain a fixed temperature difference between the heating elements it controls and the heating elements controlled by said third controller.

10. A method according to claim 7 wherein a respective temperature sensor is connected to each of said first, second, third and fourth controllers and said transferring further comprises moving all said temperature sensors from heating element to heating element in sequence together with transfers of said controllers throughout the movement of the gradient.

* * * * *